United States Patent
Levchik et al.

(10) Patent No.: US 7,427,652 B2
(45) Date of Patent: *Sep. 23, 2008

(54) COMPOSITION OF EPOXY RESIN, OH-TERMINATED PHOSPHONATE OLIGOMER AND INORGANIC FILLER

(75) Inventors: Sergei Levchik, Croton-on-Hudson, NY (US); Mark Buczek, Sleepy Hollow, NY (US)

(73) Assignee: Supresta LLC, Ardsley, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/534,137

(22) PCT Filed: Nov. 7, 2003

(86) PCT No.: PCT/US03/35519

§ 371 (c)(1),
(2), (4) Date: Nov. 4, 2005

(87) PCT Pub. No.: WO2004/044054

PCT Pub. Date: May 27, 2004

(65) Prior Publication Data

US 2006/0142427 A1 Jun. 29, 2006

(51) Int. Cl.
*C08K 3/22* (2006.01)
*C08L 63/02* (2006.01)
(52) U.S. Cl. .................. 525/486; 523/457; 525/485; 525/523
(58) Field of Classification Search .............. None
See application file for complete search history.

(56) References Cited

U.S. PATENT DOCUMENTS

| | | | | |
|---|---|---|---|---|
| 2,682,522 A | * | 6/1954 | Coover, Jr. et al. | 528/167 |
| 2,716,101 A | * | 8/1955 | Coover, Jr. et al. | 528/169 |
| 4,268,633 A | * | 5/1981 | Fearing | 521/168 |
| 4,331,614 A | * | 5/1982 | Schmidt et al. | 558/162 |
| 4,415,719 A | * | 11/1983 | Schmidt et al. | 528/167 |
| 4,719,279 A | * | 1/1988 | Kauth et al. | 528/169 |
| 4,970,249 A | * | 11/1990 | Joswig et al. | 524/125 |
| 5,945,222 A | | 8/1999 | Nagase et al. | |
| 6,005,064 A | | 12/1999 | Hirai et al. | |
| 6,214,455 B1 | | 4/2001 | Honda et al. | |
| 2005/0020800 A1 | * | 1/2005 | Levchik et al. | 528/108 |

FOREIGN PATENT DOCUMENTS

| | | | | |
|---|---|---|---|---|
| CA | 1335680 C | * | 5/1995 | |
| DE | 3139958 A | * | 4/1983 | |
| EP | 0451101 | | 10/1991 | |
| EP | 1 116 774 | | 7/2001 | |
| FR | 1438381 A | * | 4/1966 | |
| FR | 2348197 A | * | 12/1977 | |
| GB | 1308521 A | * | 2/1973 | |
| JP | 08-183835 | | 7/1996 | |
| JP | 2000-256633 | | 9/2000 | |
| JP | 2001-19746 A | * | 1/2001 | |
| JP | 2001-302879 A | * | 10/2001 | |
| JP | 2002088138 A | * | 3/2002 | |
| WO | 99/00451 | | 1/1999 | |
| WO | 01/74960 | | 10/2001 | |
| WO | 02/055 603 | | 7/2002 | |
| WO | 02/072655 | | 9/2002 | |
| WO | 03/029 258 | | 4/2003 | |
| WO | 03/029258 | | 4/2003 | |

OTHER PUBLICATIONS

Database WPI Section Ch, Week 200143, Derwent Publications Ltd., London, 6B; Class A21, An2001-400810 XP002274895 & JP2001-019746, Jan. 23, 2001.

Database WPI Section Ch, Week 200230, Derwent Publications Ltd., London, 6B; Class A21, An2002-246988, XP002274896 & JP2001-302879, Oct. 31, 2001.

Database WPI Section Ch, Week 200105, Derwent Publications Ltd., London, GB; Class A21, An2001-034272, XP002274897 & JP2000-226499, Aug. 15, 2000.

Takeda et al., "Environment-Friendly, Halogen-Free Material for PCBs," pp. S11-4-1- to S11-4-5, Presented at IPC Printed Circuits Expo® 2001.

Liu et al., "Flame-Retardant Epoxy Resin from o-Cresol Novolac Epoxy Cured with a Phosphorus-Containing Aralkyl Novolac"; Journal of Polymer Science, Part A: Polymer Chemistry vol. 40,2329-2339(2002).

\* cited by examiner

*Primary Examiner*—Robert Sellers
(74) *Attorney, Agent, or Firm*—Dilworth & Barrese, LLP

(57) ABSTRACT

An epoxy resin composition is disclosed that comprises an epoxy resin, a reactive phosphonate curing agent, an inorganic filler, whose presence allows for reduced amounts of phosphonate as compared to a composition not containing the filler, an optional polybenzoxazine resin, and an optional co-curing agent.

18 Claims, No Drawings

COMPOSITION OF EPOXY RESIN, OH-TERMINATED PHOSPHONATE OLIGOMER AND INORGANIC FILLER

The present invention relates to an epoxy resin composition that can be used, for example, in printed wiring boards for electronic applications and that represents a novel improvement, for example, over the type of compositions described in Japanese Patent Publication No. 2001/302,879 to Shin Kobe Electric Manufacturing Co. Ltd./Hitachi Chemical Co. Ltd.

The composition of the present invention contains, as one essential component, an epoxy resin. This component is present at from about 20% to about 50%, by weight of the total weight of the composition. Preferably, this component is a non-halogen containing epoxy resin, such as a bisphenol A-type of epoxy resin, or other resins of this general type that have utility for the manufacture of printed wiring boards or other electronic substrate materials of that type (bisphenol F epoxy, phenolic novolak epoxy, cresol novolak epoxy, and/or bisphenol A novolak epoxy resins). Compatible mixtures of any of these resins may be employed.

An additional optional, but preferred, component for the compositions of the present invention is a polybenzoxazine resin in an amount of up to about 50%, by weight of the total weight of the composition, preferably, from about 5% to about 20%, by weight. This composition is a thermosetting resin that contains a dihydrobenzoxazine ring that is formed by the reaction depicted below:

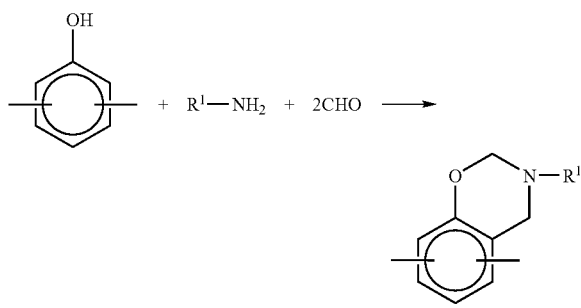

This component and its process of manufacture is further described in U.S. Pat. No. 5,945,222 (at Col. 2, line 59 to Col. 3, line 62), which is incorporated herein by reference.

The next additional optional component of the composition of the present invention is a co-curing agent for the aforementioned resin component(s). Mixtures of compatible co-curing agents can be used. This co-curing agent will be present at from about 0% to about 20%, by weight of the total weight of the composition, preferably from about 5% to about 15%, by weight. Representative co-curing agents include, phenol-formaldehyde, cresol-formaldehyde, novolac, novolac/melamine, phosphorylated novolac, triazine-modified novolac resins, dicyandiamide, and the like.

The compositions of the present invention also contain one or more inorganic filler material(s) at from about 10% to about 50%, by weight. The filler material or materials can be selected from such known fillers as: talc, silica, alumina, aluminum hydroxide, magnesium hydroxide, zinc borate, and the like. A preferred material for use herein is alumina trihydrate.

While PCT Published Patent Application No. WO 03/029258 teaches that epoxy resins can contain a hydroxy-terminated oligomeric phosphonate as a flame retardant, that PCT application generally shows that the level of such phosphonate needs to be in the neighborhood of from about 20% to about 30%, by weight of the epoxy resin, or higher for acceptable results. No use of filler in such compositions is mentioned. In accordance with the present invention, the additional presence of filler has allowed for the use of lower amounts of the phosphonate additive. In Table I, which is given below, Example 7 illustrates that only 10% of the phosphonate was needed. The use of the filler allows for the production of a sufficiently flame retarded epoxy composition, despite the use of lower amounts of phosphonate flame retardant, while still producing a product having good physical properties (such as, higher $T_g$, better hydrolytic stability, etc).

Each of the foregoing components of the present composition are individually known to persons of ordinary skill in the art as potential components for epoxy compositions of the present type, and they have been employed in various combinations heretofore, as exemplified by the aforementioned Japanese Patent Publication No. 2001/302,879.

The reactive phosphonate curing agent that forms a novel and essential additive herein, as compared to prior art approaches that relied upon varying combinations of the previously described components, is present at from about 3% to about 40%, by weight of the total weight of the composition, preferably from about 5% to about 20%, by weight. This flame retardant curing agent, as more fully described in PCT International Patent Publication No. WO 03/029258, is an oligomeric phosphonate comprising the repeating unit —OP(O)(R)—O-Arylene- and has a phosphorus content of greater than about 12%, by weight. The phosphonate species in the composition comprise those containing —OH end groups as well, possibly, of those not containing —OH end groups. The preferred R group is methyl, but can be any lower alkyl group.

By "Arylene" is meant any radical of a dihydric phenol. The dihydric phenol preferably should have its two hydroxy groups in non-adjacent positions. Examples include the resorcinols; hydroquinones; and bisphenols, such as bisphenol A, bisphenol F, and 4,4'-biphenol, phenolphthalein, 4,4'-thiodiphenol, or 4,4'-sulfonyldiphenol. The Arylene group can be 1,3-phenylene, 1,4-phenylene, or a bisphenol diradical unit, but it is preferably 1,3-phenylene.

This component for the epoxy resin composition of this invention can be made as described in PCT Patent Application 03/029258 by any of several routes: (1) the reaction of an RPOCl$_2$ with HO-Aryl-OH or a salt thereof, where R is lower alkyl, preferably methyl; (2) the reaction of diphenyl alkylphosphonate, preferably methylphosphonate, with HO-Arylene-OH under transesterification conditions; (3) the reaction of an oligomeric phosphite with repeating units of the structure —OP(OR')—O-Arylene- with an Arbuzov rearrangement catalyst, where R' is lower alkyl, preferably methyl; or (4) the reaction of an oligomeric phosphite with the repeating units having the structure —OP(O-Ph)—O-Arylene with trimethyl phosphite and an Arbuzov catalyst or with dimethyl methylphosphonate with, optionally, an Arbuzov catalyst-. The —OH end groups, if attached to Arylene can be produced by having a controlled molar excess of the HO-Arylene-OH in the reaction media. The —OH end groups, if acid type (P—OH), can be formed by hydrolytic reactions. It is preferred that the end groups of the oligomers be mainly -Arylene-OH types.

The epoxy resin composition of the present invention can contain optional additives as well including the following types of materials: fiber and/or cloth reinforcing additives; release agents; colorants; and the like.

EXAMPLES

Materials
Epoxy—bisphenol A type epoxy resin
Novolac—phenol-formaldehyde resin (novolac type) (auxiliary curing agent)
Melamine-novolac—copolymer of phenol, melamine and formaldehyde (auxiliary curing agent)
Phosphor-novolac—phosphorylated phenol-formaldehyde resin (auxiliary curing agent)
ATH—aluminum trihydrate
Phosphonate—reactive phosphonate curing agent where "arylene" is resorcinol
DICY—dicyandiamide (auxiliary curing agent)
AMI-2—2-methylimidazole (catalyst)
BDP—bisphenol A bis(diphenyl phosphate) Akzo Nobel brand FYROLFLEX BDP
BDP(OH)—Bisphenol A diphenylphosphate

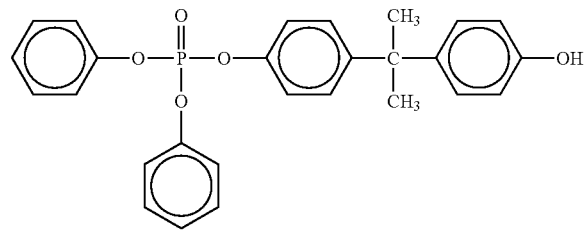

made as described in U.S. Pat. No. 3,090,799.

RDP(OH)$_2$ resorcinol bis(phenylresolcinyl phosphate)

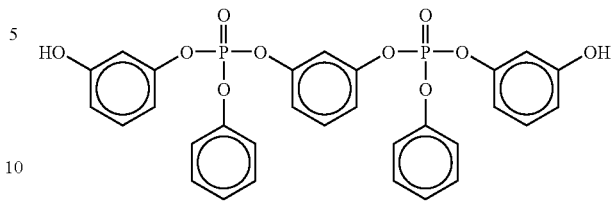

made as described in U.S. Pat. No. 5,508,462.

Experimental $T_g$—glass transition temperature measured in TMA experiments as described in IPC-TM-650 protocol.

UL 94—flammability rating according to UL 94 vertical protocol (V-0, V-1, V-2)

PCT—time of exposure to steam in Pressure Cooker Test according to IPC-TM-650 protocol. Water absorption was measured after removal of the specimen from the autoclave.

Delamination—measured in TMA experiments at 260 or 288° C. as described in IPC-TM-650 protocol CTE—coefficient of thermal expansion measured in TMA experiments at the temperatures below and above glass transition (<$T_g$ and >$T_g$ respectively). IPC-TM-650 protocol was followed.

Tables I and II that are reproduced below sets forth a number of formulations that represent embodiments of the present invention. Table III shows set of comparative formulations.

TABLE I

| | Example | | | | | | | |
|---|---|---|---|---|---|---|---|---|
| | 1 | 2 | 3 | 4 | 5 | 6 | 7 | 8 |
| Component | | | | | | | | |
| Epoxy, wt. % | 45 | 45 | 40 | 40 | 40 | 40 | 40 | 40 |
| Novolac, wt. % | 10 | 10 | 5 | 5 | | | | |
| ATH, wt. % | 25 | 25 | 35 | 35 | 35 | 30 | 50 | 50 |
| Phosphonate, wt. % | 20 | 20 | 20 | 20 | 25 | 30 | 10 | 9 |
| DICY | | | | | | | | 1 |
| AMI-2, wt. % | 0.25 | 0.5 | 0.25 | | 0.25 | 0.1 | 0.25 | 0.25 |
| Physical property | | | | | | | | |
| $T_g$, ° C. | 130 | 130 | 110 | 120 | 140 | 110 | 120 | 130 |
| UL-94, rating | Fail | Fail | V-1 | V-0 | Fail | Fail | V-0 | V-0 |
| PCT, time (min)/pass (fail) | 60/F | 60/F | 30/F | 60/F | 60/F | 60/P | 30/P | 30/F |
| water absorption, % | 0.4 | 0.4 | 0.3 | 0.3 | 0.1 | | 0.2 | 0.3 |
| Delamination at 260° C., min | | | >60 | | | | | |
| 288° C., min | | | >60 | >60 | >60 | >60 | >60 | |
| CTE, <$T_g$, 10$^6$ mm | | | 50 | 40 | 40 | | 30 | 40 |
| >$T_g$, 10$^6$ mm | | | 250 | 250 | 200 | | 160 | 195 |

TABLE II

| | Example | | | | | | | |
|---|---|---|---|---|---|---|---|---|
| | 9 | 10 | 11 | 12 | 13 | 14 | 15 | 16 |
| Component | | | | | | | | |
| Epoxy, wt. % | 30 | 20 | 20 | 20 | 40 | 35 | 20 | 20 |
| Novolac, wt. % | 10 | 10 | 5 | 5 | | | | |
| Melamine-novolac, wt. % | | | | | 15 | 10 | 10 | 5 |

TABLE II-continued

|  | Example | | | | | | | |
| --- | --- | --- | --- | --- | --- | --- | --- | --- |
|  | 9 | 10 | 11 | 12 | 13 | 14 | 15 | 16 |
| PBZ, wt. % | 15 | 15 | 15 | 15 |  |  | 15 | 15 |
| ATH, wt. % | 25 | 35 | 50 | 50 | 25 | 35 | 35 | 50 |
| Phosphonate, wt. % | 20 | 20 | 10 | 10 | 20 | 20 | 20 | 10 |
| AMI-2, wt. % | 0.25 | 0.25 | 0.25 |  | 0.25 | 0.25 | 0.25 | 0.25 |
| Physical property |  |  |  |  |  |  |  |  |
| $T_g$, °C. |  | 140 | 150 | 190 | 130 | 120 | 160 |  |
| UL-94, rating | Fail | V-1 | V-0 | V-0 | Fail | V-1 | V-1 | V-0 |
| PCT, time (min)/pass (fail) | 60/P | 90/P | 90/P | 90/F | 120/P | 120/P | 90/P | 90/F |
| water absorption, % | 0.8 | 1.2 | 0.3 | 0.5 | 1.0 | 0.9 | 1.2 | 0.2 |
| Delamination at 260° C., min |  |  |  |  | 5 | 5 |  |  |
| 288° C., min |  | >60 |  | >60 |  |  | >60 |  |
| CTE, <$T_g$, $10^6$ mm |  | 30 | 30 | 30 |  | 35 | 40 |  |
| >$T_g$, $10^6$ mm |  | 160 | 130 | 160 | 160 | 200 | 165 |  |

TABLE III (comparative)

|  | Example | | | | |
| --- | --- | --- | --- | --- | --- |
|  | 17 | 18 | 19 | 20 | 21 |
| Component |  |  |  |  |  |
| Epoxy, wt. % | 40 | 35 | 35 | 35 | 35 |
| Phosphor-novolac, wt. % | 15 | 10 |  |  |  |
| Melamine-novolac, wt. % |  |  | 10 | 10 | 10 |
| BDP, wt. % |  |  | 20 |  |  |
| BDP(OH), wt. % |  |  |  | 20 |  |
| RDP(OH)$_2$, wt. % |  |  |  |  | 20 |
| Phosphonate, wt. % | 20 | 20 |  |  |  |
| ATH, wt. % | 25 | 35 | 35 | 35 | 35 |
| AMI-2, wt. % | 0.25 | 0.25 | 0.25 | 0.25 | 0.25 |
| Physical property |  |  |  |  |  |
| $T_g$, °C. |  | 100 | 115 | 120 | 120 |
| UL-94, rating | Fail | V-1 | Fail | Fail | Fail |
| PCT, time (min)/pass (fail) | 60/F | 60/F | 30/F | 60/F | 120/P |
| water absorption, % | 0.4 | 0.4 | 0.2 | 0.3 | 0.6 |
| Delamination at 260° C., min |  | >60 |  |  |  |
| 288° C., min |  | 20 | >60 | >60 | >60 |
| CTE, <$T_g$, $10^6$ mm |  | 50 | 50 | 65 | 60 |
| >$T_g$, $10^6$ mm |  | 230 | 240 | 210 | 200 |

We claim:

1. An epoxy resin composition comprising an epoxy resin; a reactive hydroxy-terminated oligomeric phosphonate curing agent comprising the repeating unit OP(=O)(R)—O—Arylene- wherein R is lower alkyl; an inorganic filler; an optional polybenzoxazine resin; and an optional co-curing agent.

2. A composition as claimed in claim 1 wherein the epoxy resin comprises from about 10% to about 50%, by weight of the total weight of the composition.

3. A composition as claimed in claim 1 wherein the reactive hydroxy-terminated oligomeric phosphonate curing agent comprises from about 5% to about 30% by weight, of the total weight of the composition.

4. A composition as claimed in claim 1 wherein the polybenzoxazine resin comprises up to about 50%, by weight of the total weight of the composition.

5. A composition as claimed in claim 1 wherein the co-curing agent comprises from about 5% to about 20%, by weight of the total weight of the composition.

6. A composition as claimed in claim 1 wherein the inorganic filler comprises from about 10% to about 50%, by weight, of the total weight of the composition.

7. A composition as claimed in claim 1 wherein the epoxy resin comprises from about 10% to about 50%, by weight of the total weight of the composition, the reactive hydroxy-terminated oligomeric phosphonate curing agent comprises from about 5% to about 30%, by weight, of the total weight of the composition, the inorganic filler comprises from about 10% to about 50%, by weight of the total weight of the composition, and the benzoxazine resin comprises up to about 50%, by weight of the total weight of the composition.

8. A composition as claimed in claim 7 further comprising a co-curing agent at from about 5% to about 20%, by weight of the total weight of the composition.

9. A composition as claimed in claim 1 wherein the co-curing agent is selected from the group consisting of novolac, melamine-novolac, and phosphor-novolac compositions.

10. A composition as claimed in claim 2 wherein the co-curing agent is selected from the group consisting of novolac, melamine-novolac, and phosphor-novolac compositions.

11. A composition as claimed in claim 3 wherein the co-curing agent is selected from the group consisting of novolac, melamine-novolac, and phosphor-novolac compositions.

12. A composition as claimed in claim 4 wherein the co-curing agent is selected from the group consisting of novolac, melamine-novolac, and phosphor-novolac compositions.

13. A composition as claimed in claim 5 wherein the co-curing agent is selected from the group consisting of novolac, melamine-novolac, and phosphor-novolac compositions.

14. A composition as claimed in claim 6 wherein the co-curing agent is selected from the group consisting of novolac, melamine-novolac, and phosphor-novolac compositions.

15. A composition as claimed in claim 8 wherein the co-curing agent is selected from the group consisting of novolac, melamine-novolac, and phosphor-novolac compositions.

16. A composition as claimed in claim 1 wherein R is methyl.

17. A composition as claimed in claim 1 wherein Arylene is 1,3-phenylene.

18. A composition as claimed in claim 1 wherein the epoxy resin composition contains a polybenzoxazine resin.

* * * * *